(12) United States Patent
Atalla et al.

(10) Patent No.: US 10,658,999 B1
(45) Date of Patent: May 19, 2020

(54) ON-CHIP HARMONIC FILTERING FOR RADIO FREQUENCY (RF) COMMUNICATIONS

(71) Applicant: Silicon Laboratories Inc., Austin, TX (US)

(72) Inventors: Essam S. Atalla, Round Rock, TX (US); Ruifeng Sun, Charlottesville, VA (US); Mohamed M. Elkholy, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/506,409

(22) Filed: Jul. 9, 2019

(51) Int. Cl.
*H03H 7/38* (2006.01)
*H03F 3/189* (2006.01)
*H03H 7/01* (2006.01)

(52) U.S. Cl.
CPC ............... *H03H 7/38* (2013.01); *H03F 3/189* (2013.01); *H03H 7/1766* (2013.01)

(58) Field of Classification Search
CPC ......... H03H 7/38; H03H 7/1766; H03F 3/189
See application file for complete search history.

(56) References Cited

U.S. PATENT DOCUMENTS

| | | | |
|---|---|---|---|
| 5,375,256 A | 12/1994 | Yokoyama et al. | |
| 6,735,418 B1 | 5/2004 | MacNally et al. | |
| 7,009,455 B2 | 3/2006 | Toncich et al. | |
| 7,671,693 B2 | 3/2010 | Brobston et al. | |
| 8,975,981 B2 | 3/2015 | See et al. | |
| 9,431,990 B2 | 8/2016 | Du Toit et al. | |
| 9,608,591 B2 | 3/2017 | Manssen et al. | |
| 10,141,971 B1 * | 11/2018 | Elkholy | H04B 1/0458 |
| 2008/0094149 A1 | 4/2008 | Brobston | |
| 2010/0308933 A1 * | 12/2010 | See | H03F 1/565 |
| | | | 333/32 |

(Continued)

OTHER PUBLICATIONS

Liu, et al. "A 1.9nJ/b 2.4GHz Multistandard (Bluetooth Low Energy/Zigbee/IEEE802.15.6) Transceiver for Personal/Body-Area Networks," IEEE International Solid-State Circuits Conference, 3 pgs. (2013).

(Continued)

*Primary Examiner* — Nguyen T Vo
(74) *Attorney, Agent, or Firm* — Egan Peterman Enders Huston

(57) ABSTRACT

Systems and methods are disclosed for on-chip harmonic filtering for radio frequency (RF) communications. A filtering and matching circuit for an integrated circuit includes a first capacitance coupled in parallel with a first inductance, a second inductance coupled to the first inductance, and a variable second capacitance coupled between the first and second inductance. The variable second capacitance is controlled to provide filtering with respect to the RF signal as well as impedance matching with respect to a load coupled to the connection pad. For one embodiment, the variable second capacitance includes a coarse-tune variable capacitor circuit and a fine-tune variable capacitor circuit. The coarse-tuning controls impedance matching, and the fine tuning controls a notch for the filtering. The load can be an antenna for the RF communications. The integrated circuit can include a receive path, a transmit path, or both.

21 Claims, 5 Drawing Sheets

(56) References Cited

U.S. PATENT DOCUMENTS

| | | |
|---|---|---|
| 2013/0063223 A1 | 3/2013 | See et al. |
| 2016/0020818 A1 | 1/2016 | Chee et al. |
| 2016/0127063 A1* | 5/2016 | Leipold .............. H01F 27/2804 |
| | | 370/343 |

OTHER PUBLICATIONS

Liu, et al., "A 3.7mW-RX 4.4mW-TX Fully Integrated Bluetooth Low Energy/IEEE802.15.4) Proprietary SoC With an ADPLL-Based Fast Frequency Offset Compensation in 40nm CMOS," IEEE International Solid-State Circuits Conference, 3 pgs. (2015).
Prummel, et al., "A 10mW Bluetooth Low-Energy Transceiver With On-Chip Matching," IEEE International Solid-State Circuits Conference, 3 pgs. (2015).
Sano, et al., "A 6.3mW BLE Transceiver Embedded RX Image-Rejection Filter and TX Harmonic-Suppression Filter Reusing On-Chip Matching Network," IEEE International Solid-State Circuits Conference, 3 pgs. (2015).
Kuo et al., "A Fully Integrated 28nm Bluetooth Low-Energy Transmitter With 36% System Efficiency at 3dBm," IEEE, 4 pgs. (2015).
Ba, et al., "A 2.4GHz Class-D Power Amplifier with Conduction Angle Calibration for -50dBc Harmonic Emissions," IEEE, 4 pages (2014).
Fritzin, et al., "Design and Analysis of a Class-D Stage with Harmonic Suppression," IEEE Transactions on Circuits and Systems I: Regular Papers, vol. 59, issue 6, 10 pgs (Jun. 2012).
Sun et al., "Harmonic Filtering for High Power Radio Frequency (RF) Communications", U.S. Appl. No. 16/586,153, filed Sep. 27, 2019, 26 pgs.

\* cited by examiner

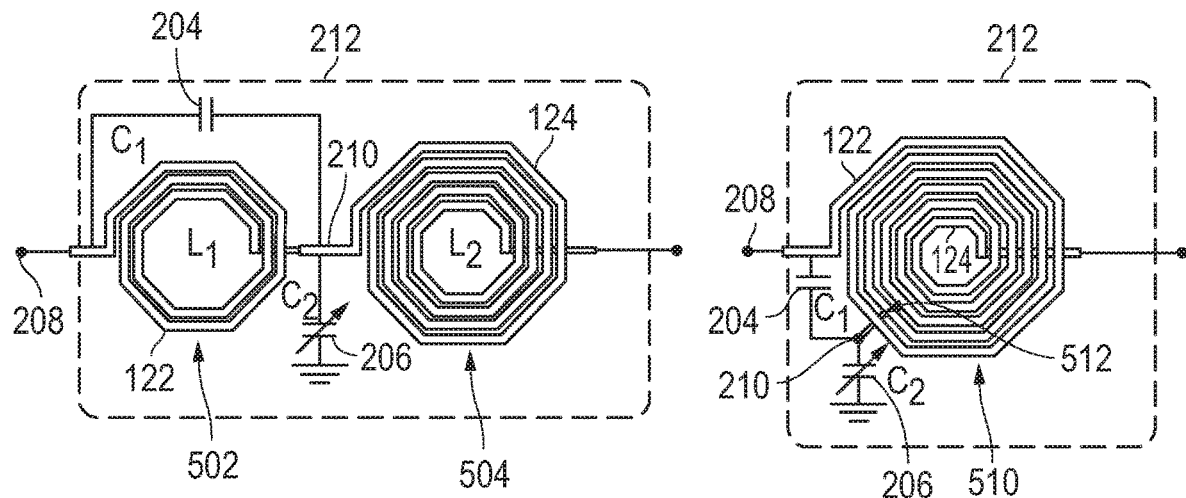
*FIG. 5A*  *FIG. 5B*
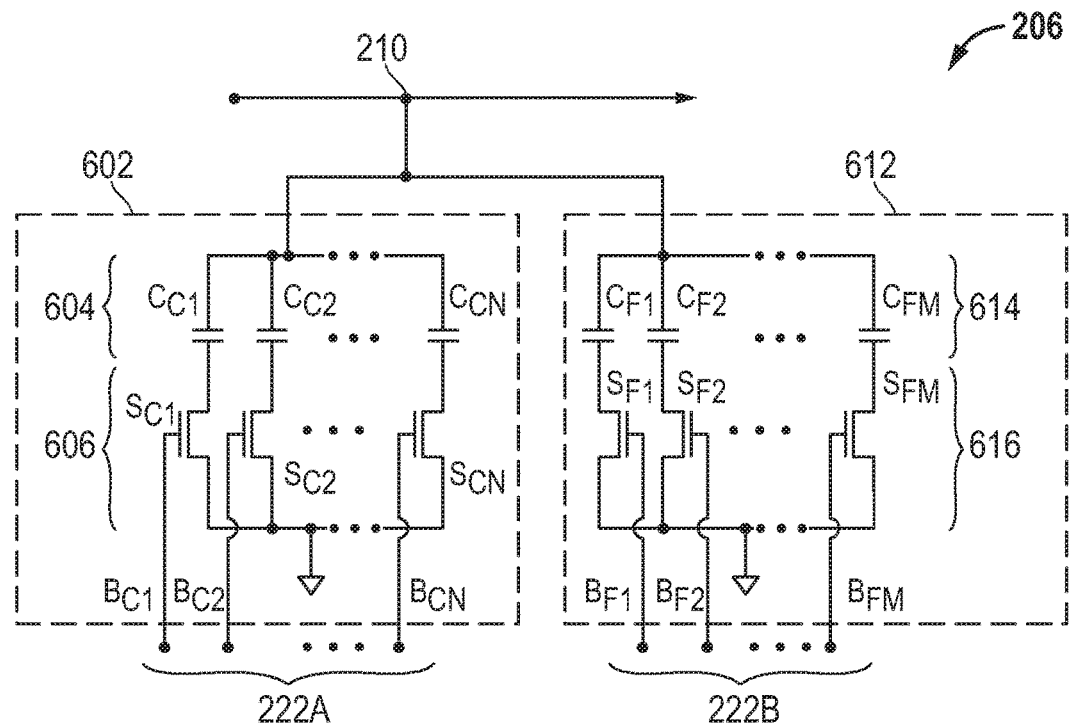
*FIG. 6*

US 10,658,999 B1

ON-CHIP HARMONIC FILTERING FOR RADIO FREQUENCY (RF) COMMUNICATIONS

TECHNICAL FIELD

The technical field relates to wireless radio frequency (RF) communications and more particularly to harmonic filtering of RF communications.

BACKGROUND

Wireless radio frequency (RF) devices often include integrated circuits (ICs) that operate to receive RF input signals, transmit RF output signals, or both receive and transmit RF signals. Where receive functionality is included, RF communication ICs typically receive analog signals from antennas and convert the analog signals to digital data. Where transmit functionality is included, RF communication ICs typically convert digital data to analog output signals and transmit these analog output signals through power amplifiers to antennas. To increase or maximize power transfer from antennas during receive modes, matching circuits can be used so that the input impedance matches the impedance of the antenna during reception. To increase or maximize power transfer to antennas during transmit modes, matching circuits can also be used so that the output impedance matches the impedance of the antenna during transmit. Configurable matching circuits have been included on-chip to provide this impedance matching.

FIG. 1 (Prior Art) is a circuit diagram of an example embodiment 100 that includes an on-chip matching network 120 that is configurable based upon a variable capacitance 126. The integrated circuit 102 includes a receive mixer 108, a low noise amplifier 116, a frequency synthesizer 110 including a controlled oscillator 112, a transmit mixer 109, a power amplifier 118, and a matching network 120. A harmonic rejection filter 106 is coupled off-chip between the connection pad 132 and an input/output node 103. It is also noted that for some prior solutions, the matching network 120 is also included off-chip, and one off-chip circuit block can be used to provide both a matching function and a harmonic rejection function. The input/output node 103 is coupled to an antenna, which is represented by load 105. One common impedance for an antenna is 50 Ohms, although other antenna impedances can also be used. The integrated circuit 102 includes a receive path and a transmit path.

For the receive path, an RF input signal is received at the antenna or load 105 and is provided to connection pad 132 through the off-chip harmonic rejection filter 106. The receive signal then passes through the matching network 120 and the low noise amplifier 116 before being down-converted to a lower frequency by the receive mixer 108. The receive mixer 108 receives a local-oscillator mixing signal from the on-chip frequency synthesizer 110, which includes the controlled oscillator 112. The down-converted RF input signal 114 is then further processed by circuitry within the integrated circuit 102. For example, the down-converted RF input signal 114 can be converted to digital values by an analog-to-digital converter and then processed by digital processing circuitry within the integrated circuit 102.

For the transmit path, an analog output signal 115 is received by the power amplifier 118 through the transmit mixer 109. This analog output signal 115 can be, for example, an output from a digital-to-analog converter that receives a digital signal generated by digital processing circuitry within the integrated circuit 102. The transmit mixer 109 receives a local-oscillator mixing signal from the on-chip frequency synthesizer 110, which includes the controlled oscillator 112. The transmit mixer 109 up-converts the analog output signal 115 to an RF output signal at a desired transmit frequency. This up-converted RF output signal is provided to power amplifier 118, which can be programmable to generate a transmit output signal at a desired power level. It is also noted that the direct modulation can also be used where the local oscillator signal from frequency synthesizer 110 is modulated with the transmit data and then fed directly into the power amplifier 118. The transmit output signal is passed through the matching network 120 and the connection pad 132 to the harmonic rejection filter 106 before being transmitted through the antenna or load 105.

The configurable matching network 120 can be implemented using a first inductance 122, a second inductance 124, and a variable capacitance 126. The variable capacitance 126 is controlled to provide matching for the input and/or output impedances. For the embodiment depicted, the first inductor (L1) 122 is coupled between node 134 and node 136, and the second inductor (L2) 124 is coupled between node 136 and the pad 132. The variable capacitance (C) 126 is coupled between node 136 and ground 130 and can be controlled, for example, with an on-chip controller. During operation, the configurable matching network 120 is controlled to provide impedance matching. It is noted that U.S. Pat. No. 10,141,971 describes embodiments that provide on-chip configurable matching networks. U.S. Pat. No. 10,141,971 is hereby incorporated by reference in its entirety.

It is noted that filtering can utilize active or passive techniques. For transmit modes, active techniques rely on combining outputs of multiple power amplifiers running at different phases or rely on calibrating a conduction angle for the power amplifier. These active techniques may also use switched-capacitor circuits that create notches at frequencies that are multiples or harmonics of the transmit clock frequency. Active techniques, however, are very sensitive to timing inaccuracies and usually consume relatively high power. Passive techniques use inductors and capacitors to provide harmonic filtering and often use switched techniques. While passive techniques consume less power, passive techniques are not easily tunable because switched passive circuits usually have low quality (Q) factors that degrade maximum achievable filtering. As such, prior solutions have not used on-chip tunable passive techniques to implement harmonic filtering. Rather, off-chip filtering has been used for RF communication devices, such as the harmonic rejection filter 106 shown in FIG. 1 (Prior Art). While the off-chip harmonic rejection filter 106 improves performance of the RF communications, the external components required to implement the harmonic rejection filter 106 increase cost and size requirements for RF communication devices.

SUMMARY OF THE INVENTION

Systems and methods are disclosed for on-chip harmonic filtering for radio frequency (RF) communications. A filtering and matching circuit is coupled to a connection pad for an integrated circuit. The circuit includes a first capacitance coupled in parallel with a first inductance, a second inductance coupled to the first inductance, and a variable second capacitance coupled between the first and second inductance. The variable second capacitance is controlled to provide filtering with respect to the RF signal as well as impedance matching with respect to a load coupled to the connection pad. For one embodiment, the variable second capacitance includes a coarse-tune variable capacitor circuit and a fine-tune variable capacitor circuit. The coarse tuning is used to control impedance matching, and the fine tuning is used to control a notch for the filtering. The load can be an antenna for the RF communications. The integrated circuit can also include a receive path, a transmit path, or both. Other features and variations can also be implemented, and related systems and methods can be utilized, as well.

For one embodiment, an integrated circuit is disclosed including a circuit coupled between a first node and a connection pad for the integrated circuit and a controller. The circuit includes a first inductance coupled between the first node and a second node, a first capacitance coupled between the first node and the second node in parallel with the first inductance, a variable second capacitance coupled between the second node and ground, and a second inductance coupled between the second node and the connection pad. The controller is coupled to control a capacitance amount for the variable second capacitance to determine filtering with respect to a radio frequency (RF) signal passing through the circuit and to determine impedance matching with respect to a load coupled to the connection pad.

In additional embodiments, two separate inductor structures are used to provide the first inductance and the second inductance, or a tapped inductor structure is used to provide the first inductance and the second inductance. In further embodiments, the controller is coupled to provide one or more control signals to the variable second capacitance based upon calibration data stored within the integrated circuit. In still further embodiments, the integrated circuit further includes a low noise amplifier coupled to the first node and configured to receive an RF input signal from the load through the circuit and a power amplifier coupled to the first node and configured to transmit an RF output signal to the load through the circuit.

In additional embodiments, the variable second capacitance includes a first variable capacitor circuit having a coarse-tune control signal as an input from the controller and a second variable capacitor circuit having a fine-tune control signal as an input from the controller. In further embodiments, the coarse-tune control signal adjusts impedance matching for the circuit, and wherein the fine-tune control signal adjusts filtering for the circuit. In still further embodiments, the fine-tune control signal is adjusted to filter a third harmonic of the RF signal.

For one embodiment, a circuit within an integrated circuit is disclosed including a first inductance coupled between a first node and a second node within the integrated circuit, a first capacitance coupled between the first node and the second node within the integrated circuit in parallel with the first inductance, a variable second capacitance coupled between the second node and ground, and a second inductance coupled between the second node and the connection pad for the integrated circuit. The capacitance amount for the variable second capacitance determines filtering with respect to a radio frequency (RF) signal passing through the circuit and determines impedance matching with respect to a load coupled to the connection pad.

In additional embodiments, two separate inductor structures are used to provide the first inductance and the second inductance, or a tapped inductor structure is used to provide the first inductance and the second inductance.

In additional embodiments, the variable second capacitance includes a first variable capacitor circuit having a coarse-tune control signal as an input and a second variable capacitor circuit having a fine-tune control signal as an input. In further embodiments, the coarse-tune control signal adjusts impedance matching for the circuit, and wherein the fine-tune control signal adjusts filtering for the circuit. In still further embodiments, the fine-tune control signal is adjusted to filter a third harmonic of the RF signal.

In additional embodiments, a value for the first capacitance and a nominal value for the variable second capacitance are selected to determine impedance matching for the circuit, and the variable second capacitance is adjusted to determine a notch frequency for the filtering.

For one embodiment a method to operate an integrated circuit is disclosed including passing a radio frequency (RF) signal through a circuit within an integrated circuit and controlling a capacitance amount for the second variable capacitance. The circuit includes a first inductance coupled between a first node and a second node, a first capacitance coupled between the first node and the second node in parallel with the first inductance, a variable second capacitance coupled between the second node and ground, and a second inductance coupled between the second node and a connection pad for the integrated circuit. The controlling determines filtering with respect to the radio frequency (RF) signal and determines impedance matching with respect to a load coupled to the connection pad.

In additional embodiments, two separate inductor structures are used to provide the first inductance and the second inductance, or a tapped inductor structure is used to provide the first inductance and the second inductance. In further embodiments, the method includes receiving, with a low noise amplifier, an RF input signal from the load through the circuit and transmitting, with a power amplifier, an RF output signal to the load through the circuit.

In additional embodiments, the variable second capacitance includes a first variable capacitor circuit and a second variable capacitor circuit, and the controlling includes adjusting the first variable capacitor circuit with a coarse-tune control signal and adjusting the second variable capacitor circuit with a fine-tune control signal. In further embodiments, the method includes using the coarse-tune control signal to adjust impedance matching for the circuit and using the fine-tune control signal to adjust filtering for the circuit. In still further embodiments, the fine-tune control signal is adjusted to filter a third harmonic of the RF signal.

In additional embodiments, the method includes setting a value for the first capacitance and a nominal value for the variable second capacitance to determine impedance matching for the circuit, and adjusting the variable second capacitance to determine a notch frequency for the filtering.

Different or additional features, variations, and embodiments can also be implemented, and related systems and methods can be utilized as well.

DESCRIPTION OF THE DRAWINGS

It is noted that the appended drawings illustrate only example embodiments of the invention and are, therefore, not to be considered limiting of its scope, for the invention may admit to other equally effective embodiments.

FIG. 5A is a diagram of an example embodiment where the circuit is implemented using two inductor structures formed within an integrated circuit.

FIG. 5B is a diagram of an example embodiment where the circuit is implemented using a single, tapped inductor structure formed within an integrated circuit.

FIG. 6 is a circuit diagram of an example embodiment where coarse tuning of the variable capacitance is used to provide impedance matching and fine tuning of the variable capacitance is used to provide filtering.

DETAILED DESCRIPTION OF THE INVENTION

Systems and methods are disclosed for on-chip harmonic filtering for radio frequency (RF) communications. For disclosed embodiments, a filtering and matching circuit is included within an integrated circuit to remove the need for an external harmonic rejection filter. The circuit includes a first capacitance coupled in parallel with a first inductance, a second inductance, and a variable second capacitance. The variable second capacitance is controlled to provide on-chip filtering as well as impedance matching. Other features and variations can be implemented for the embodiments described herein, and related systems and methods can be utilized, as well.

In contrast with prior solutions, the embodiments described herein use additional on-chip capacitances to achieve on-chip tunable filtering in combination with a reconfigurable on-chip matching network. This on-chip tunable filtering can be used to provide harmonic rejection filtering for RF communications, such as filtering of third harmonics of transmit frequencies. Using the disclosed embodiments, off-chip filtering can be removed, particularly for low power applications. For high power applications, additional off-chip filtering can be provided due to the limited on-chip quality (Q) factors. Other variations can also be implemented. Further, it is noted that the RF communications can include communications within one or more frequency bands or related channels at frequencies from about 3 kilohertz (kHz) to 3 GHz or more. For one embodiment, RF communications are made using multiple channels within a 2.4 gigahertz (GHz) frequency band.

Figure 1:
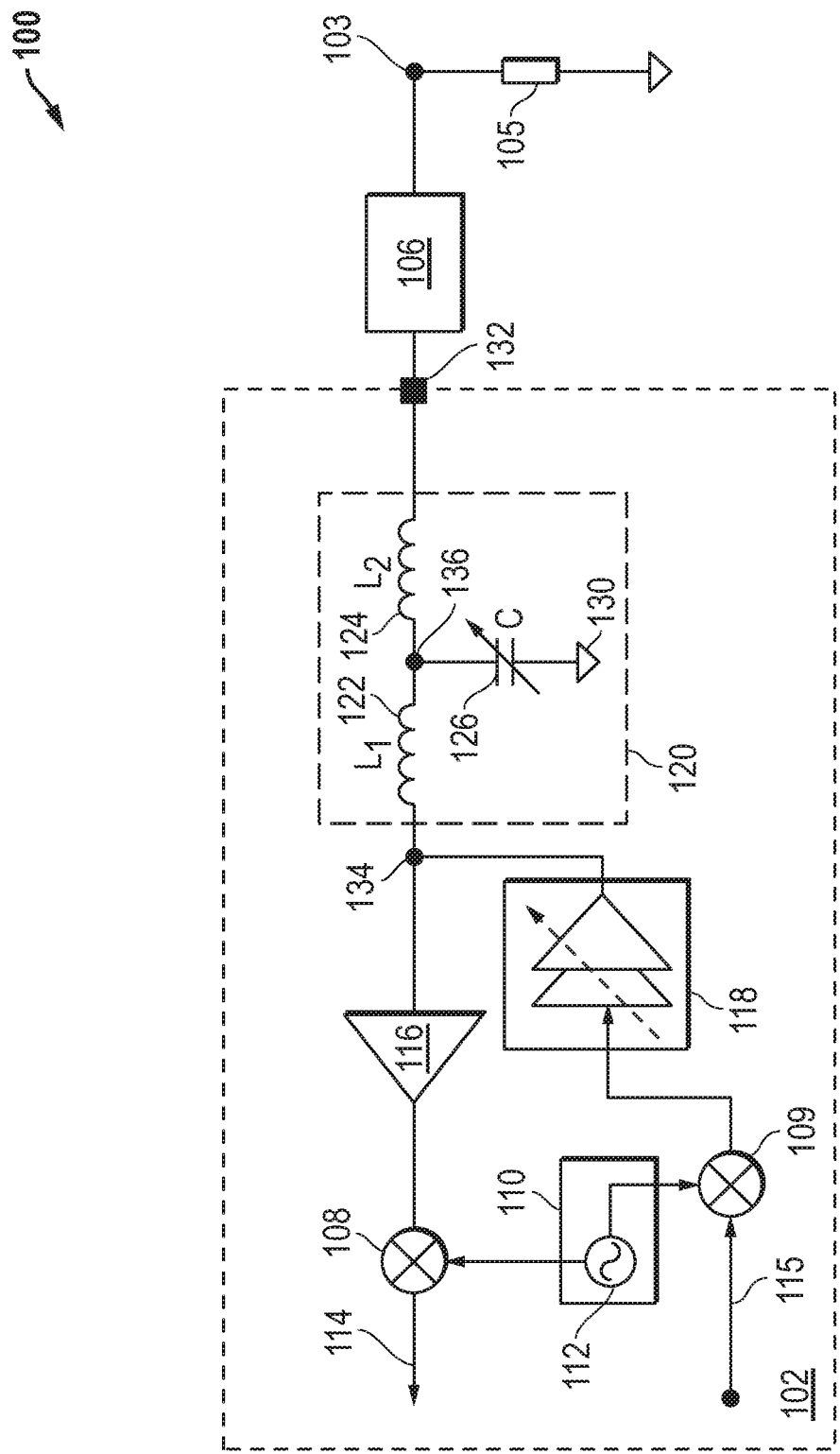
FIG. 1 (Prior Art) is a circuit diagram of an example embodiment that includes an on-chip matching network that is configurable based upon a variable capacitance.
Figure 2:
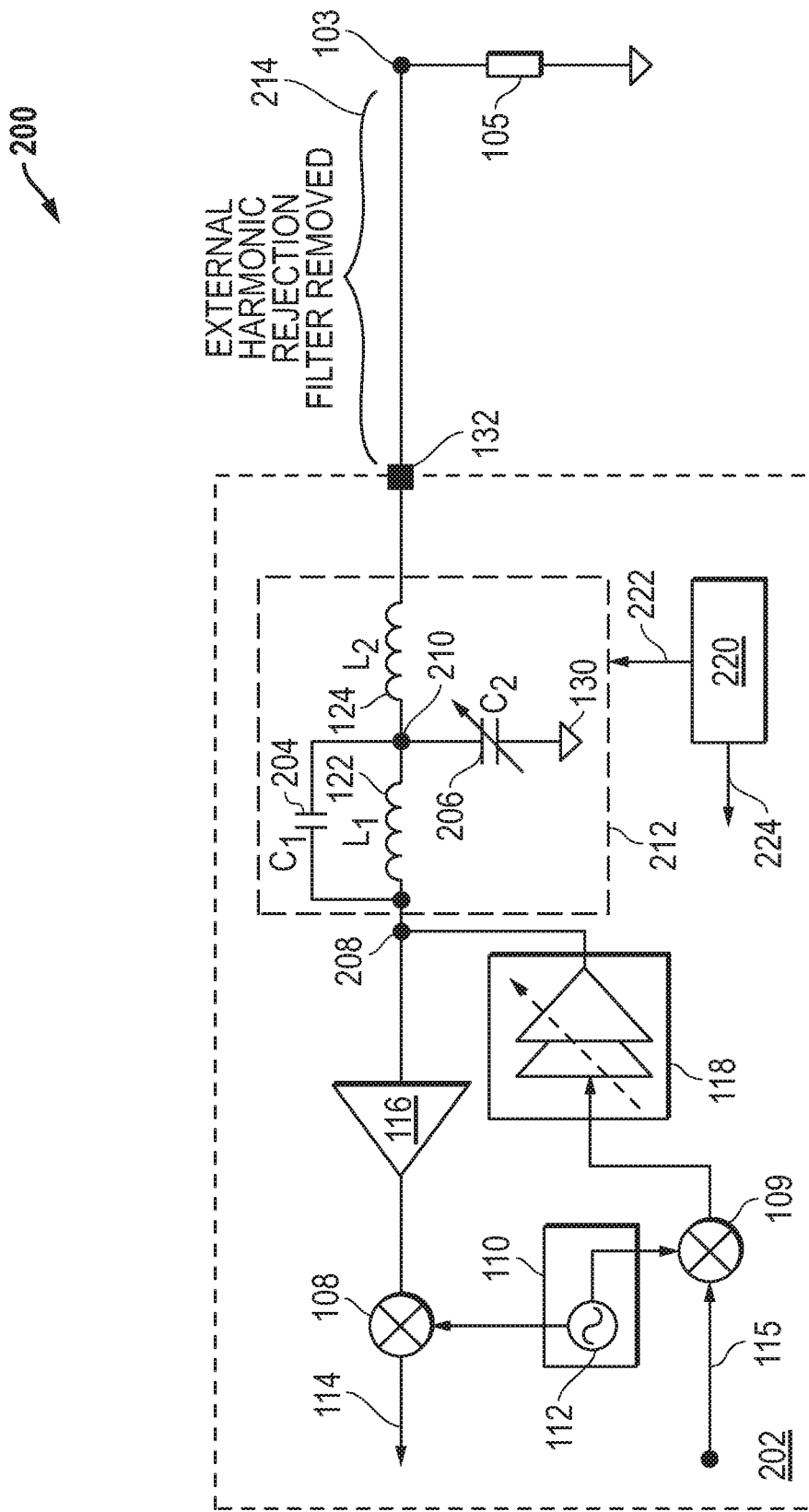
FIG. 2 is a circuit diagram of an example embodiment where a capacitance has been added to a reconfigurable matching network to achieve rejection filtering as well as impedance matching within a common on-chip filtering and matching circuit.

FIG. 2 is a circuit diagram of an example embodiment 200 where a capacitance 204 has been added to a reconfigurable matching network to achieve rejection filtering as well as impedance matching within a common filtering and matching circuit 212 for an integrated circuit 202. The example embodiment 200 is similar to example embodiment 100 of FIG. 1 (Prior Art) except that the external harmonic rejection filter 106 has been removed as indicated by bracket 214 and the on-chip capacitance 204 has been added in parallel with the inductance (L1) 122. With the addition of capacitance 204, adjustments to a variable second capacitance (C2) 206 provide tuning for filtering as well as for impedance matching. As such, the additional on-chip first capacitance 204 provides rejection filtering without requiring the off-chip circuitry used in prior solutions. It is again noted, however, that additional off-chip filtering circuitry could be added while still taking advantage of the on-chip tunable filtering techniques described herein.

The filtering and matching circuit 212 is configurable based upon a selection of the capacitance amount for the first capacitance (C1) 204 and control of the variable second capacitance (C2) 206. Similar to integrated circuit 102 in FIG. 1 (Prior Art), the integrated circuit 202 of FIG. 2 also includes a receive mixer 108, a low noise amplifier 116, a frequency synthesizer 110 including a controlled oscillator 112, a transmit mixer 109, and a power amplifier 118. The connection pad 132 is coupled to an input/output node 103. Although not depicted, a blocking capacitor can also be included between the connection pad 132 and the input/output node 103. The input/output node 103 is coupled to an antenna, which is represented by load 105. One common impedance for an antenna is 50 Ohms, although other antenna impedances can also be used. The integrated circuit 202 includes a receive path and a transmit path. It is also noted that different or additional circuitry could also be included within the integrated circuit 202.

For the receive path, an RF input signal is received at the antenna or load 105 and is provided to connection pad 132. The receive signal then passes through the filtering and matching circuit 212. The impedance matching provided by circuit 212 improves receive signal levels. The filtering provided by circuit 212 typically does not affect signal reception as this filtering is typically tuned to filtering of transmit harmonics such as third harmonics of the transmit frequency. After passing through circuit 212, the receive signal then passes through the low noise amplifier 116 before being down-converted to a lower frequency by the mixer 108. The mixer 108 receives a local-oscillator mixing signal from the on-chip frequency synthesizer 110, which includes the controlled oscillator 112. The down-converted RF input signal 114 is then further processed by circuitry within the integrated circuit 202. For example, the down-converted RF input signal 114 can be converted to digital values by an analog-to-digital converter and then processed by digital processing circuitry within the integrated circuit 202. It is noted that additional or different receive path circuitry could also be used while still taking advantage of the on-chip tunable filtering techniques described herein.

For the transmit path, an analog output signal 115 is received by the power amplifier 118 through the transmit mixer 109. This analog output signal 115 can be, for example, an output from a digital-to-analog converter that receives a digital signal generated by digital processing circuitry within the integrated circuit 202. The transmit mixer 109 receives a local-oscillator mixing signal from the on-chip frequency synthesizer 110, which includes the controlled oscillator 112. The transmit mixer 109 up-converts the analog output signal 115 to an RF output signal at a desired transmit frequency. This up-converted RF output signal is provided to power amplifier 118, which can be programmable to generate a transmit output signal at a desired power level. It is also noted that the direct modulation can also be used where the local oscillator signal from frequency synthesizer 110 is modulated with digital or analog transmit data and then fed directly into the power amplifier 118. The transmit output signal is then passed through the filtering and matching circuit 212. As described herein, in addition to providing impedance matching, the circuit 212 operates to filter frequencies within the RF output signal, such as third harmonics of this transmit frequency, based upon the addition of capacitance (C1) 204. The transmit output signal then passes through the connection pad 132 before being transmitted through the antenna or load 105. It is noted that additional or different transmit path circuitry could also be used while still taking advantage of the on-chip tunable filtering techniques described herein.

For the embodiment depicted, the filtering and matching circuit 212 is implemented using a first inductance 122, a second inductance 124, a first capacitance 204, and a variable second capacitance 206. The first inductance (L1) 122 is coupled between node 208 and node 210, and the second inductance (L2) 124 is coupled between node 210 and the pad 132. The first capacitance (C1) 204 is coupled between nodes 208 and 210 in parallel with the first inductance (L1) 122. The second variable capacitance (C2) 206 is coupled between node 210 and ground 130 and is controlled by controller 220 through one or more control signals 222. The controller 220 can also provide control signals 224 to other circuitry within the integrated circuit 202 and/or to external circuitry.

According to the embodiments described herein, filtering is provided by the addition of the fixed first capacitance (C1) 204. In particular, adding the capacitance (C1) 204 in parallel with the inductance (L1) 122 creates a parallel resonant circuit that can be used to block undesired frequencies, such as the third harmonics of the frequency for the RF transmit signal. For example, where third harmonics are rejected for the output signal 115, these third harmonics circulate only within the power amplifier 118 and do not flow to the off-chip antenna or load 105. The circuit 212 can also filter higher order harmonics. This on-chip filtering provided by the addition of capacitance (C1) 204 in parallel to the inductance (L1) 122 between nodes 208 and 210 creates on-chip filtering that allows removal of the external off-chip harmonic rejection filter 106 of FIG. 1 (Prior Art). Thus, the two to three discrete components that are typically used off-chip to implement the harmonic rejection filter 106 can be removed thereby reducing the cost and size of the resulting RF communication device.

In addition to this filtering, the circuit 212 also provides configurable impedance matching through control of the variable second capacitance (C2) 206. This impedance matching translates the input and/or output impedance to a desirable impedance so that the power amplifier 118 can deliver increased or maximized output power to the antenna or target load 105. It is noted that the impedance matching provided by inductances 122/124 and variable capacitance 206 is similar to the impedance matching described in U.S. Pat. No. 10,141,971, which is hereby incorporated by reference in its entirety.

In contrast with prior solutions, adjustments can be made to the variable second capacitance (C2) 206 in FIG. 2 to configure both filtering and matching functions for the integrated circuit 202. For one embodiment as described in more detail with respect to FIG. 6 below, coarse-tune adjustments are made to the variable capacitance (C2) 206 to configure the impedance matching provided by the circuit 212, and fine-tune adjustments are made to the variable capacitance (C2) 206 to configure filtering provided by the circuit 212. Other variations can also be implemented.

It is further noted that values for the first capacitance (C1) 204, the first inductance (L1) 122, the second inductance (L2) 124, and the variable second capacitance (C2) 206 can be selected based upon frequencies to be filtered and impedances to be matched for any particular solution. Magnetic coupling between the inductances 122/124 is one parameter that can be considered in determining these values.

Figure 3A:
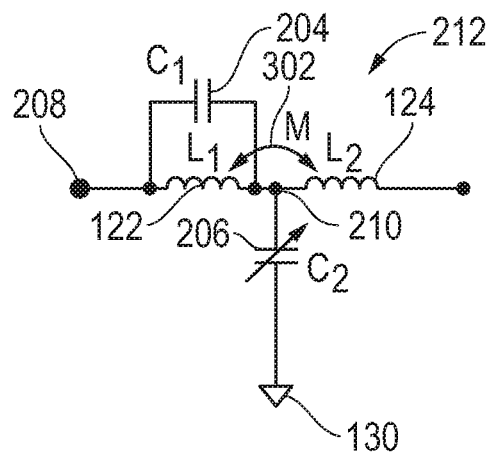
FIG. 3A is a circuit diagram of an example embodiment indicating magnetic coupling between inductances within the filtering and matching circuit.
Figure 3B:
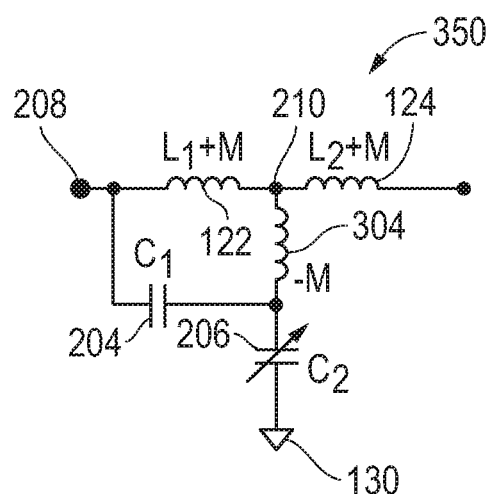
FIG. 3B is a circuit diagram of an example embodiment for the equivalent circuit with an equivalent inductor in series with the variable capacitance in FIG. 3A.

FIG. 3A is a circuit diagram of an example embodiment indicating magnetic coupling (M) 302 between the inductances 122 and 124 within the filtering and matching circuit 212. This magnetic coupling can be modeled as an equivalent inductance in series with the variable capacitance (C2) 206 as shown in FIG. 3B. It is noted that inductances 122 and 124 can implemented with a variety of techniques. For example, inductances 122 and 124 can be separate inductors or can be two portions of a single inductor structure that is tapped by the variable capacitance (C2) 206. Other implementations can also be use.

FIG. 3B is a circuit diagram of an example embodiment for the equivalent circuit 350 with an equivalent inductor (−M) 304 in series with the variable capacitance (C2) 206. Due to the magnetic coupling represented by this equivalent inductor (−M) 304, an estimate for the resonant frequency involves inductor (L1) 122, capacitance (C1) 204, equivalent inductor (−M), and variable capacitance (C2) 206. Assuming no current flows out of inductor (L2) 124 at the resonance frequency ($f_o$), the following equation can be used to estimate the resonant frequency ($f_o$) and select inductance and capacitance values.

$$f_o = \frac{1}{2\pi\sqrt{L_1 C_1 - MC_2}}$$

Figure 4:
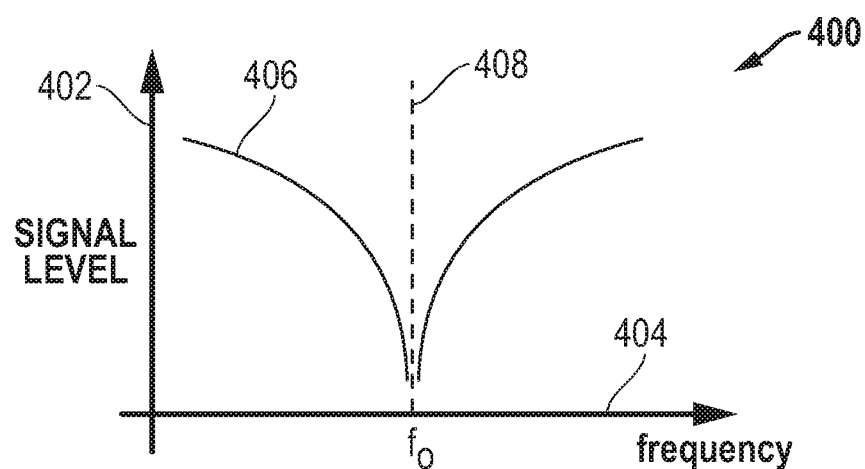
FIG. 4 is a diagram of an example embodiment representing a frequency response for the circuit in FIG. 3A as represented by the equivalent circuit in FIG. 3B.

FIG. 4 is a diagram of an example embodiment 400 representing a frequency response 406 for the circuit 212 in FIG. 3A as represented by the equivalent circuit 350 in FIG. 3B. The vertical axis 402 represents signal level, and the horizontal axis 404 represents frequency. The resonant frequency ($f_o$) 408 creates a notch within the frequency response 406, and this notch represents the center frequency for the filtering provided by the filtering and matching circuit 212. It is noted that the notch at the resonant frequency ($f_o$) is preferably narrow to provide a high quality (Q) factor for the filtering provided by the filtering and matching circuit 212.

Because the variable capacitance (C2) 206 is part of the resonance, it can be used to tune the center frequency for the on-chip filtering provided by the addition of capacitance (C1) 204. For example, variable capacitance (C2) 206 can be adjusted to reject a target harmonic frequency of the RF output signal. Thus, in addition to tunable impedance matching provided by the variable capacitance (C) 126 in FIG. 1 (Prior Art), the second variable capacitance (C2) 206 in combination with the additional first capacitance (C1) 204 allows the center frequency for on-chip filtering provided by circuit 212 to be tuned as well as its impedance matching.

It is noted that the first fixed capacitance (C1) 204 could also be implemented as a variable capacitor and could be used to tune the on-chip filter. However, using the variable capacitance (C2) 206 alone to tune the center frequency or notch frequency for the filtering provides a significant advantage. Although conceptually, capacitance (C1) 204 could be implemented as a variable capacitor and used for tuning the notch frequency, this solution is not preferable. Adding switches in series with capacitors to implement capacitance (C1) 204 as a variable capacitance would result in a significantly degraded quality (Q) factor, and a narrow notch for the filtering at a selected frequency or harmonic would not be achieved. In contrast, adding switches in series with capacitors to implement capacitance (C2) 206 as a variable capacitance does not significantly degrade the overall quality (Q) factor. With selection of the component values for the inductances (L1, L2) 122 and 124, the first capacitance (C1) 204, and the second variable capacitance (C2) 206, harmonic filtering can be achieved on-chip along with impedance matching.

It is further noted that characterization data can be collected and used to calibrate the tuning of the variable capacitance (C2) 206. For example, calibration can be performed at different process, temperature, and/or other operating parameters. Resulting calibration data and associated filter settings can then be stored within the integrated circuit 202. For example, calibration data can be stored within an on-chip memory coupled to controller 220. This stored calibration data can then be used to adjust the control signals 222 provided to the circuit 212. Other variations could also be implemented.

FIG. 5A is a diagram of an example embodiment where the circuit 212 is implemented using two inductor structures 502 and 504 formed within integrated circuit 202. Inductor structure 502 provides inductance (L1) 122, and inductor structure 504 provides inductance (L2) 124. Capacitance (C1) 204 is coupled between nodes 208 and 210 in parallel with inductor structure 502 for inductance (L1) 122. Variable capacitance (C2) 206 is coupled to node 210 between the two inductor structures 502 and 504. It is noted that the physical distance between the two inductors 122 and 124 is a parameter that affects the equivalent inductor (−M) 404 and therefore affects the resonance frequency for the circuit 212.

FIG. 5B is a diagram of an example embodiment where the circuit 212 is implemented using a single, tapped inductor structure 510 formed within integrated circuit 202. Inductor structure 510 is tapped by variable capacitance (C2) 206 at tap point 512 to form two inductor portions. A first coil portion heading back to node 208 provides inductance (L1) 122. A second coil portion heading the other direction provides inductance (L2) 124. Capacitance (C1) 204 is coupled between nodes 208 and 210 in parallel with the inductance (L1) 122. Variable capacitance (C2) 206 is coupled between node 210 and ground, and node 210 is coupled to tap point 512 within the inductor structure 510.

FIG. 6 is a circuit diagram of an example embodiment for the variable capacitance 206 where coarse tuning of the variable capacitance (C2) 206 is used to provide impedance matching and fine tuning of the variable capacitance (C2) 206 is used to provide filtering. For the example embodiment depicted, a first variable capacitor circuit 602 provides the coarse tuning, and a second variable capacitor circuit 612 provides the fine tuning. The first variable capacitor circuit 602 includes a plurality of capacitors ($C_{C1}, C_{C2} \ldots C_{CN}$) 604 coupled to a plurality of switches ($S_{C1}, S_{C2} \ldots S_{CN}$) 606. The switches ($S_{C1}, S_{C2} \ldots S_{CN}$) 606 are controlled by a coarse-tune control signal 222A including a plurality of control bits ($B_{C1}, B_{C2} \ldots B_{CN}$). The second variable capacitor circuit 612 includes a plurality of capacitors ($C_{F1}, C_{F2} \ldots C_{FN}$) 614 coupled to a plurality of switches ($S_{F1}, S_{F2} \ldots S_{FN}$) 616. The switches ($S_{F1}, S_{F2} \ldots S_{FN}$) 616 are controlled by a fine-tune control signal 222B including a plurality of control bits ($B_{F1}, B_{F2} \ldots B_{FN}$). As indicated above, the coarse-tune control signal 222A can be used to provide impedance matching, and the fine-tune control signal 222B can be used to provide harmonic filtering. The coarse-tune control signal 222A and the fine-tune control signal 222B can be output by a controller 220. Other variations can also be implemented.

Figure 7A:
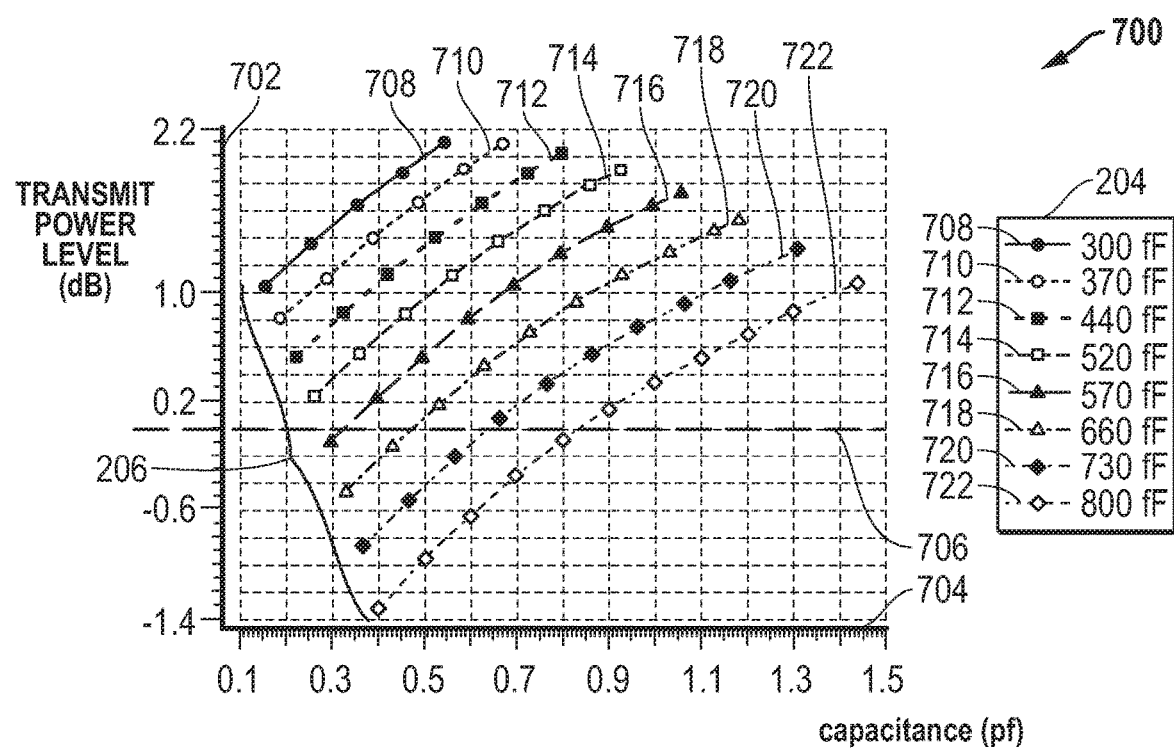
FIG. 7A is a diagram of an example embodiment for transmit power levels with respect to selected capacitance values for the filtering and matching circuit.

FIG. 7A is a diagram of an example embodiment 700 for transmit power levels with respect to values for the capacitance (C1) 204 and varied capacitances for the capacitance (C2) 206 within the filtering and matching circuit 212. The vertical axis 702 represents the power level in decibels relative to a milliwatt (dBm), and the horizontal axis 704 represents capacitance in pico-farads (pf). Values 708, 710, 712, 714, 716, 718, 720, and 722 were selected for the capacitance (C1) 204 and are represented in femto-farads (fF). The capacitance for the capacitance (C2) 206 was then varied to generate the corresponding power-level response curves shown in embodiment 700. Preferably, a power-level response curve is selected so that the power levels are above zero dBm so that the circuit 212 does not reduce the output power levels. This zero dBm level is s represented by dashed line 706. It is noted that the zero-dBm power amplifier represented by FIG. 7A is provided as one example embodiment. Different power amplifier implementations could also be used while still taking advantage of the on-chip tunable filtering techniques described herein.

Figure 7B:
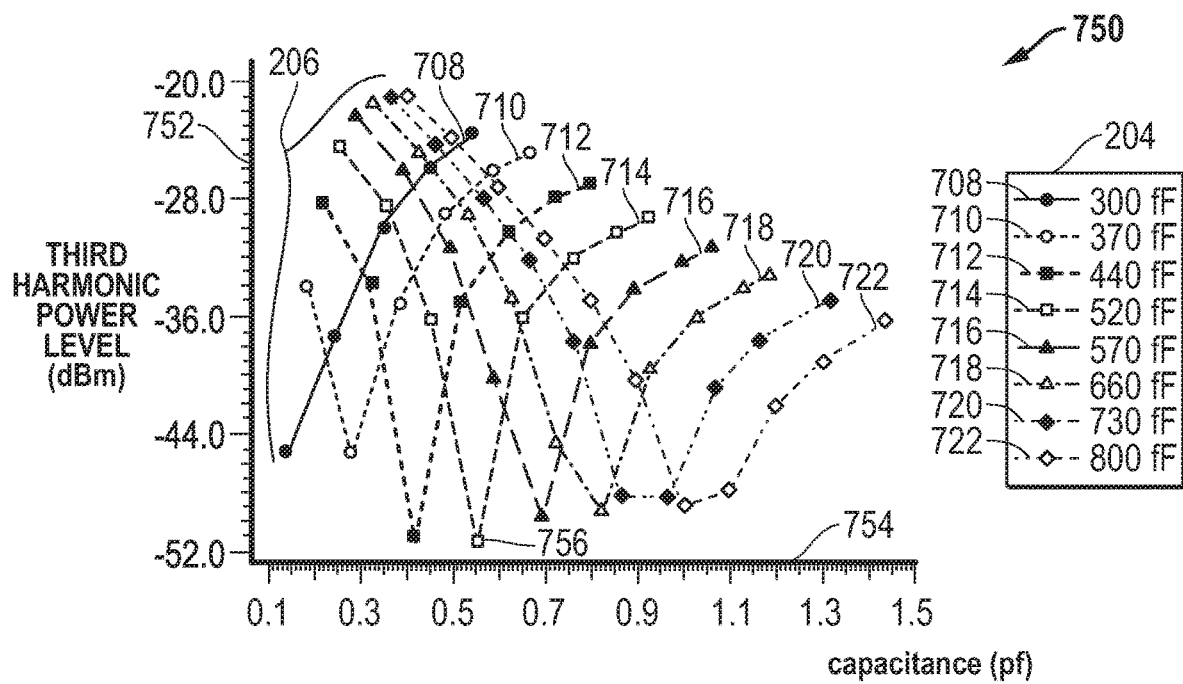
FIG. 7B is a diagram of an example embodiment for third harmonic power levels with respect to selected capacitance values for the filtering and matching circuit.

FIG. 7B is a diagram of an example embodiment 750 for third harmonic power levels with respect to values for the capacitance (C1) 204 and varied capacitances for the capacitance (C2) 206 within the filtering and matching circuit 212. The vertical axis 752 represents the third harmonic power level in decibels relative to a milliwatt (dBm), and the horizontal axis 754 represents capacitance in pico-farads (pF). Values 708, 710, 712, 714, 716, 718, 720, and 722 were selected for the capacitance (C1) 204 and matches those in FIG. 7A. The capacitance for the capacitance (C2) 206 was then varied to generate the corresponding power levels shown in embodiment 750. Preferably, capacitances are selected so that a deep and narrow notch is achieved for circuit 212. As represented by point 756, a deep and narrow notch of negative 51 dBm is achieved with value 714. Looking to FIG. 7A, the value 714 also achieves a power-level response curve above the zero dBm level represented by dashed line 702. As such, for one example embodiment, a value of about 520 fF for capacitance (C1) 204 and a nominal value of about 550 fF for capacitance (C2) 206 can be selected. Where the example embodiment of FIG. 6 is used, the nominal value for capacitance (C2) 206 can represent a coarse-tune selection to provide tunable impedance matching, and capacitance (C2) 206 can then be further adjusted using a fine-tune selection to provide tunable filtering.

It is noted that the functional blocks, devices, and/or circuitry described herein can be implemented using hardware, software, or a combination of hardware and software. In addition, one or more processing devices (e.g., central processing units (CPUs), controllers, microcontrollers, microprocessors, hardware accelerators, processors, programmable integrated circuitry, FPGAs (field programmable gate arrays), ASICs (application specific integrated circuits), and/or other processing devices) executing software, firmware, and/or other program instructions can be used to implement the disclosed embodiments. It is further understood that one or more of the operations, tasks, functions, or methodologies described herein can be implemented, for example, as software, firmware and/or other program instructions that are embodied in one or more non-transitory tangible computer-readable mediums (e.g., data storage devices, flash memory, random access memory, read only memory, programmable memory devices, reprogrammable storage devices, hard drives, floppy disks, DVDs, CD-ROMs, and/or any other tangible data storage medium) and that are used to program the one or more processing devices (e.g., central processing units (CPUs), controllers, microcontrollers, microprocessors, hardware accelerators, processors, programmable integrated circuitry, FPGAs (field programmable gate arrays), ASICs (application specific integrated circuits), and/or other processing devices) to perform the operations, tasks, functions, or methodologies described herein.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. An integrated circuit, comprising:
    a circuit coupled between a first node and a connection pad for the integrated circuit, the circuit comprising:
        a first inductance coupled between the first node and a second node;
        a first capacitance coupled between the first node and the second node in parallel with the first inductance, the first capacitance being a fixed capacitance;
        a variable second capacitance coupled between the second node and ground; and
        a second inductance coupled between the second node and the connection pad; and
    a controller coupled to control a capacitance amount for the variable second capacitance to determine filtering with respect to a radio frequency (RF) signal passing through the circuit and to determine impedance matching with respect to a load coupled to the connection pad,
    wherein the variable second capacitance comprises:
        a first variable capacitor circuit having a coarse-tune control signal as an input from the controller; and
        a second variable capacitor circuit having a fine-tune control signal as an input from the controller.

2. The integrated circuit of claim 1, wherein two separate inductor structures are used to provide the first inductance and the second inductance, or wherein a tapped inductor structure is used to provide the first inductance and the second inductance.

3. The integrated circuit of claim 1, wherein the controller is coupled to provide one or more control signals to the variable second capacitance based upon calibration data stored within the integrated circuit.

4. The integrated circuit of claim 1, further comprising:
    a low noise amplifier coupled to the first node and configured to receive an RF input signal from the load through the circuit; and
    a power amplifier coupled to the first node and configured to transmit an RF output signal to the load through the circuit.

5. The integrated circuit of claim 1, wherein the coarse-tune control signal adjusts impedance matching for the circuit, and wherein the fine-tune control signal adjusts filtering for the circuit.

6. The integrated circuit of claim 5, wherein the fine-tune control signal is adjusted to filter a third harmonic of the RF signal.

7. The integrated circuit of claim 1, wherein a value for the first capacitance and a nominal value for the variable second capacitance are selected to determine impedance matching for the circuit, and wherein the variable second capacitance is adjusted to determine a notch frequency for the filtering.

8. A circuit within an integrated circuit, comprising:
    a first inductance coupled between a first node and a second node within the integrated circuit;
    a first capacitance coupled between the first node and the second node within the integrated circuit in parallel with the first inductance;
    a variable second capacitance coupled between the second node and ground; and
    a second inductance coupled between the second node and a connection pad for the integrated circuit;
    wherein a capacitance amount for the variable second capacitance determines filtering with respect to a radio frequency (RF) signal passing through the circuit and determines impedance matching with respect to a load coupled to the connection pad;
    wherein a value for the first capacitance and a nominal value for the variable second capacitance are selected to determine impedance matching for the circuit; and
    wherein the variable second capacitance is adjusted to determine a notch frequency for the filtering.

9. The circuit of claim 8, wherein two separate inductor structures are used to provide the first inductance and the second inductance, or wherein a tapped inductor structure is used to provide the first inductance and the second inductance.

10. The circuit of claim 8, wherein the first capacitance is a fixed capacitance.

11. A circuit within an integrated circuit, comprising:
    a first inductance coupled between a first node and a second node within the integrated circuit;
    a first capacitance coupled between the first node and the second node within the integrated circuit in parallel with the first inductance;
    a variable second capacitance coupled between the second node and ground, the variable second capacitance comprising:
        a first variable capacitor circuit having a coarse-tune control signal as an input; and
        a second variable capacitor circuit having a fine-tune control signal as an input; and
    a second inductance coupled between the second node and a connection pad for the integrated circuit;
    wherein a capacitance amount for the variable second capacitance determines filtering with respect to a radio frequency (RF) signal passing through the circuit and determines impedance matching with respect to a load coupled to the connection pad.

12. The circuit of claim 11, wherein the coarse-tune control signal adjusts impedance matching for the circuit, and wherein the fine-tune control signal adjusts filtering for the circuit.

13. The circuit of claim 12, wherein the fine-tune control signal is adjusted to filter a third harmonic of the RF signal.

14. The circuit of claim 11, wherein the first capacitance is a fixed capacitance.

15. A method to operate an integrated circuit, comprising:
passing a radio frequency (RF) signal through a circuit within an integrated circuit, the circuit comprising:
    a first inductance coupled between a first node and a second node;
    a first capacitance coupled between the first node and the second node in parallel with the first inductance;
    a variable second capacitance coupled between the second node and ground; and
    a second inductance coupled between the second node and a connection pad for the integrated circuit; and
controlling a capacitance amount for the variable second capacitance to determine filtering with respect to the radio frequency (RF) signal and to determine impedance matching with respect to a load coupled to the connection pad;
wherein the variable second capacitance comprises a first variable capacitor circuit and a second variable capacitor circuit; and
wherein the controlling comprises:
    adjusting the first variable capacitor circuit with a coarse-tune control signal; and
    adjusting the second variable capacitor circuit with a fine-tune control signal.

16. The method of claim 15, further comprising using the coarse-tune control signal to adjust impedance matching for the circuit, and using the fine-tune control signal to adjust filtering for the circuit.

17. The method of claim 16, wherein the fine-tune control signal is adjusted to filter a third harmonic of the RF signal.

18. The circuit of claim 15, wherein the first capacitance is a fixed capacitance.

19. A method to operate an integrated circuit, comprising:
passing a radio frequency (RF) signal through a circuit within an integrated circuit, the circuit comprising:
    a first inductance coupled between a first node and a second node;
    a first capacitance coupled between the first node and the second node in parallel with the first inductance, the first capacitance being a fixed capacitance;
    a variable second capacitance coupled between the second node and ground; and
    a second inductance coupled between the second node and a connection pad for the integrated circuit; and
controlling a capacitance amount for the variable second capacitance to determine filtering with respect to the radio frequency (RF) signal and to determine impedance matching with respect to a load coupled to the connection pad,
wherein a value for the first capacitance and a nominal value for the variable second capacitance are set to determine impedance matching for the circuit, and wherein the variable second capacitance is adjusted to determine a notch frequency for the filtering.

20. The method of claim 19, wherein two separate inductor structures are used to provide the first inductance and the second inductance, or wherein a tapped inductor structure is used to provide the first inductance and the second inductance.

21. The method of claim 19, further comprising:
    receiving, with a low noise amplifier, an RF input signal from the load through the circuit; and
    transmitting, with a power amplifier, an RF output signal to the load through the circuit.

\* \* \* \* \*